(12) United States Patent
Niu et al.

(10) Patent No.: US 11,462,835 B2
(45) Date of Patent: Oct. 4, 2022

(54) METHOD FOR TUNING AN ANTENNA WITH A DVC

(71) Applicant: CAVENDISH KINETICS, INC., San Jose, CA (US)

(72) Inventors: Chenhui Niu, San Jose, CA (US); Ray Parkhurst, Santa Clara, CA (US); Paul Anthony Tornatta, Jr., Melbourne, FL (US); Lars Ernst Johnsson, Palo Alto, CA (US)

(73) Assignee: Qorvo US, Inc., Greensboro, NC (US)

( * ) Notice: Subject to any disclaimer, the term of this patent is extended or adjusted under 35 U.S.C. 154(b) by 927 days.

(21) Appl. No.: 16/316,311

(22) PCT Filed: Jul. 19, 2017

(86) PCT No.: PCT/US2017/042701
§ 371 (c)(1),
(2) Date: Jan. 8, 2019

(87) PCT Pub. No.: WO2018/017635
PCT Pub. Date: Jan. 25, 2018

(65) Prior Publication Data
US 2020/0274246 A1    Aug. 27, 2020

Related U.S. Application Data

(60) Provisional application No. 62/364,754, filed on Jul. 20, 2016.

(51) Int. Cl.
*H01Q 15/14* (2006.01)
*H04B 1/04* (2006.01)
(Continued)

(52) U.S. Cl.
CPC ........... *H01Q 15/148* (2013.01); *G01R 27/02* (2013.01); *G01R 27/2605* (2013.01); *H04B 1/0458* (2013.01); *H03J 2200/39* (2013.01)

(58) Field of Classification Search
CPC .. G01R 27/02; G01R 27/2605; H01Q 15/148; H03J 2200/39; H04B 1/0458
(Continued)

(56) References Cited

U.S. PATENT DOCUMENTS 8,957,827 B1 * 2/2015 Lee .................. H01Q 5/378
343/702
2008/0174503 A1 * 7/2008 Kim .................. H01Q 9/16
343/793
(Continued)

FOREIGN PATENT DOCUMENTS

EP    2690794 A1    1/2014
JP    H07273681 A   10/1995
(Continued)

OTHER PUBLICATIONS

Notice of Reasons of Rejection for Japanese Patent Application No. 2019502056, dated Aug. 31, 2021, 7 pages.
(Continued)

*Primary Examiner* — Tan H Trinh
(74) *Attorney, Agent, or Firm* — Withrow & Terranova, P.L.L.C.

(57) ABSTRACT

The present disclosure generally relates to any device capable of wireless communication, such as a mobile telephone or wearable device, having one or more antennas. After measuring reflection coefficients of a device at three different DVC states, the reflection coefficient for all other DVC states can be calculated. Thus, based solely upon three reflection coefficient measurements, the antenna can be tuned to adjust for any changes in impedance at the antenna.

21 Claims, 6 Drawing Sheets

(51) Int. Cl.
*G01R 27/02* (2006.01)
*G01R 27/26* (2006.01)

(58) Field of Classification Search
USPC ......... 455/77; 333/17.3, 17.1; 343/702, 739, 343/793
See application file for complete search history.

(56) References Cited

U.S. PATENT DOCUMENTS

| | | | |
|---|---|---|---|
| 2011/0043328 A1* | 2/2011 | Bassali | G07C 9/00182 340/5.71 |
| 2012/0041699 A1 | 2/2012 | Sestok | |
| 2012/0056689 A1* | 3/2012 | Spears | H04B 1/0458 333/17.3 |
| 2012/0286892 A1* | 11/2012 | Gu | H04B 1/525 333/17.1 |
| 2013/0041699 A1 | 2/2013 | Fisher | |
| 2013/0052967 A1* | 2/2013 | Black | H04B 1/0458 455/77 |
| 2013/0113484 A1* | 5/2013 | Kumar | G01R 33/3628 324/318 |
| 2014/0300520 A1* | 10/2014 | Nguyen | H01Q 13/206 343/739 |
| 2016/0134016 A1 | 5/2016 | Hsu et al. | |
| 2017/0358839 A1* | 12/2017 | Wu | H01Q 1/2225 |
| 2018/0277960 A1* | 9/2018 | Johnsson | H01Q 1/243 |

FOREIGN PATENT DOCUMENTS

| | | |
|---|---|---|
| JP | H08213920 A | 8/1996 |
| JP | 2005354502 A | 12/2005 |

OTHER PUBLICATIONS

Second Office Action for Chinese Patent Application No. 201780045012.8, dated Nov. 30, 2020, 15 pages.
First Office Action for Chinese Patent Application No. 201780045012.8, dated Mar. 12, 2020, 18 pages.
International Preliminary Report on Patentability for International Patent Application No. PCT/US2017/042701, dated Jan. 31, 2019, 9 pages.
International Search Report and Written Opinion for PCT/US2017/042701, dated Oct. 13, 2017.
Deal, W.R. et al., "A Simple CAD-Based Method to Develop and Evaluate Calibration Standards," IEEE Microwave Magazine, vol. 7, Issue 3, Jun. 2006, IEEE, pp. 70-84.
Examination Report for European Patent Application No. 17748596.8, dated Sep. 25, 2020, 6 pages.
Examination Report for European Patent Application No. 17748596.8, dated Jan. 27, 2022, 4 pages.
Decision to Grant for Japanese Patent Application No. 2019502056, dated Feb. 8, 2022, 5 pages.

* cited by examiner

METHOD FOR TUNING AN ANTENNA WITH A DVC

CROSS-REFERENCE TO RELATED APPLICATION & PRIORITY CLAIM

This application claims benefit of and priority to U.S. Provisional Patent Application Ser. No. 62/364,754, filed Jul. 20, 2016, which is herein incorporated by reference in its entirety for all applicable purposes.

BACKGROUND

Field

Embodiments of the present disclosure generally relate to any device with a wireless modem, such as a mobile telephone or a wearable device, having one or more antennas to support the wireless communication of the device with the corresponding wireless network, further referred to simply as a device.

Description of the Related Art

In an ideal world, a device always receives a strong, constant signal. To this point in time the strength of a wireless signal is typically always changing, and the ideal world for a device can only be found in "free space", where the device is suspended in air without movement and without any physical interaction with a human being. Since actual use of a device typically requires physical interaction between the user and the device the ideal free space condition only exists at fabrication facilities and testing facilities. Once in operation and in the hands of the user, the device will experience changes in the signal environment, for example the so-called head/hand effect, caused by the proximity of the user to the device.

The head/hand effect refers to the change in the electrical characteristics of the antenna of the device, typically caused by capacitive loading of the antenna due to the proximity of the user's human tissue. In free space there is no user, but in practical usage there is almost always a user. The moment the user physically interacts with the device or comes close to the device, the electrical characteristics of the antenna change. Hence, the antenna of the device, once in operation, rarely operates with the ideal electrical characteristics that are achieved and measured during production, by means of calibration, typically performed in free space.

When the electrical characteristics of the antenna change due to environmental or head/hand effects, the antenna's ability to properly transmit/receive a wireless signal can be severely impacted, which can lead to dropped connections, missed calls, messages not sending/receiving, and disruptions of data traffic and internet operation. This performance degradation is due both to changes in the antenna's radiated performance as well as changes to the impedance the antenna presents to the transmit/receive signal paths in the device.

Therefore, there is a strong need to maintain the antenna's radiation and impedance characteristics during operation, and compensate for any changes thereof caused by interaction with the user and/or changes in the environment.

SUMMARY

The present disclosure generally relates to any device capable of wireless communication, such as a mobile telephone or wearable device, having one or more antennas. After measuring three different reflection coefficients at three different digital variable capacitor (DVC) states, the reflection coefficient for all other DVC states can be calculated. Thus, based solely upon three measurements, the antenna can be tuned to adjust for any changes in impedance at the antenna.

In one embodiment, a method comprises measuring the reflection coeffecient of a device at the first DVC state; changing the DVC state to a second DVC state; measuring the reflection coefficient of the device at the second DVC state; determining whether a slope look-up table is available; either a) reviewing the slope look-up table for a third DVC state to measure or b) changing the DVC state to the third DVC state; measuring the reflection coefficient of the device at the third DVC state; calculating reflection coefficients for all unmeasured DVC states; and selecting a desired DVC state.

In another embodiment, a method comprises measuring the reflection coefficient of a device at the first DVC state; measuring the reflection coefficient of the device at a second DVC state; reviewing a slope look-up table for a third DVC state to measure; measuring the reflection coefficient of the device at the third DVC state; calculating reflection coefficients for all unmeasured DVC states; and selecting a desired DVC state.

In a further embodiment, a method comprises measuring the reflection coefficient of a device at the first DVC state; measuring the reflection coefficient of the device at a second DVC state; changing the DVC state to a third DVC state; measuring the reflection coefficient of the device at the third DVC state; calculating reflection coefficients for all unmeasured DVC states; and selecting a desired DVC state.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to any device capable of wireless communication, such as a mobile telephone or wearable device, having one or more antennas. After measuring reflection coefficients at three different DVC states, the reflection coefficient for all other DVC states can be calculated. Thus, based solely upon three measurements, the antenna can be tuned to adjust for any changes in impedance at the antenna.

Figure 1:
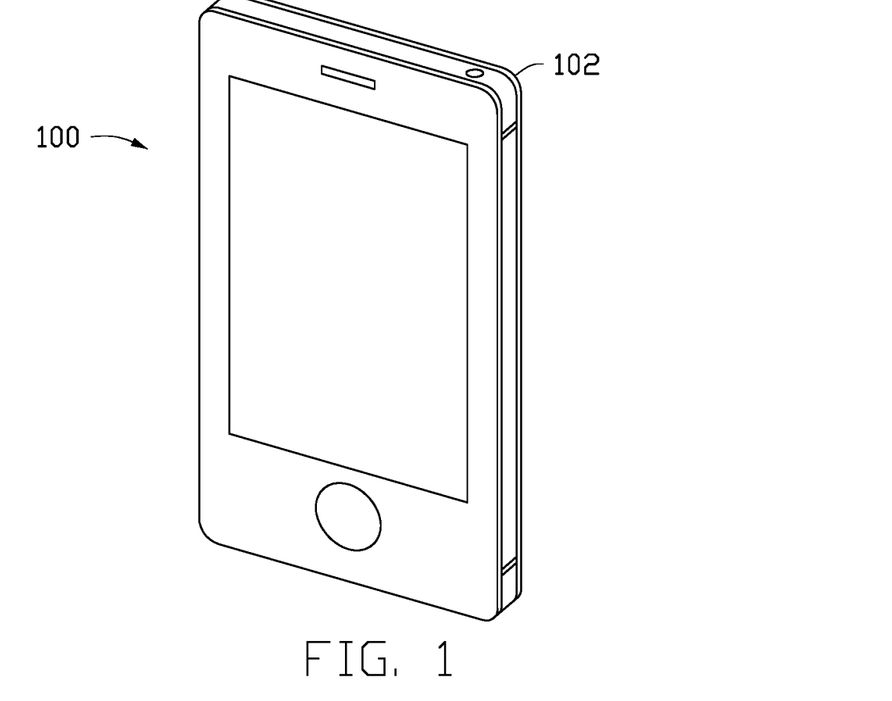
FIG. 1 is a schematic illustration of a device, in this example a cellular telephone, in free space.

FIG. 1 is a schematic illustration of a device 100 in free space, where the device has one or more antennas. The device 100 has at least one antenna 102 that may be external to the device body. It is to be understood that the antenna 102 is not limited to being external. Rather, the antenna 102 may be disposed inside the device body. The device 100 may be used to send/receive emails, voice calls, text messages, and data such as internet webpages and apps through any wireless connection, such as but not limited to a cellular service that utilizes the various frequency bands allocated for 2G, 3G, 4G LTE (long term evolution), etc, and/or WiFi, Bluetooth, NFC to name a few other wireless connection types. As shown in FIG. 1, the device 100 is in free space where no other objects, such as a human being, is disposed at a location to interfere with the device 100 operation. As the human being interacts with the device 100, however, the head/hand effect appears and the electrical characteristics of the antenna 102 changes.

Figure 2:
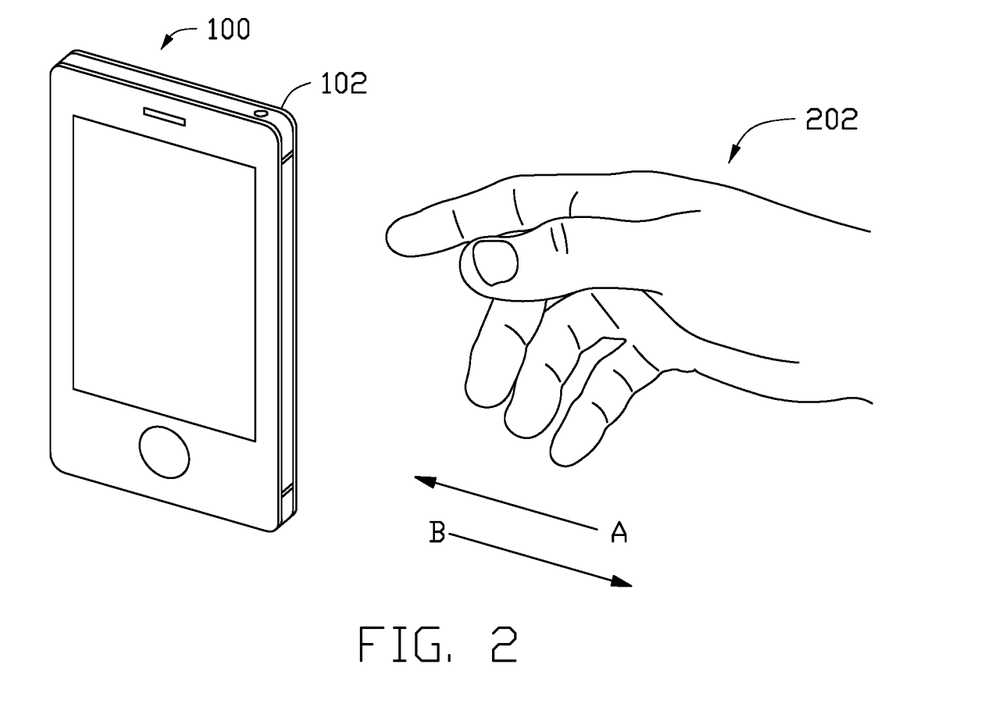
FIG. 2 is a schematic illustration of a device, in this example a cellular telephone, with a hand nearby, where the hand is a placeholder for any kind change in the electrical environment that can impact the electrical characteristics and operation of the antenna.
Figures 3, 4:
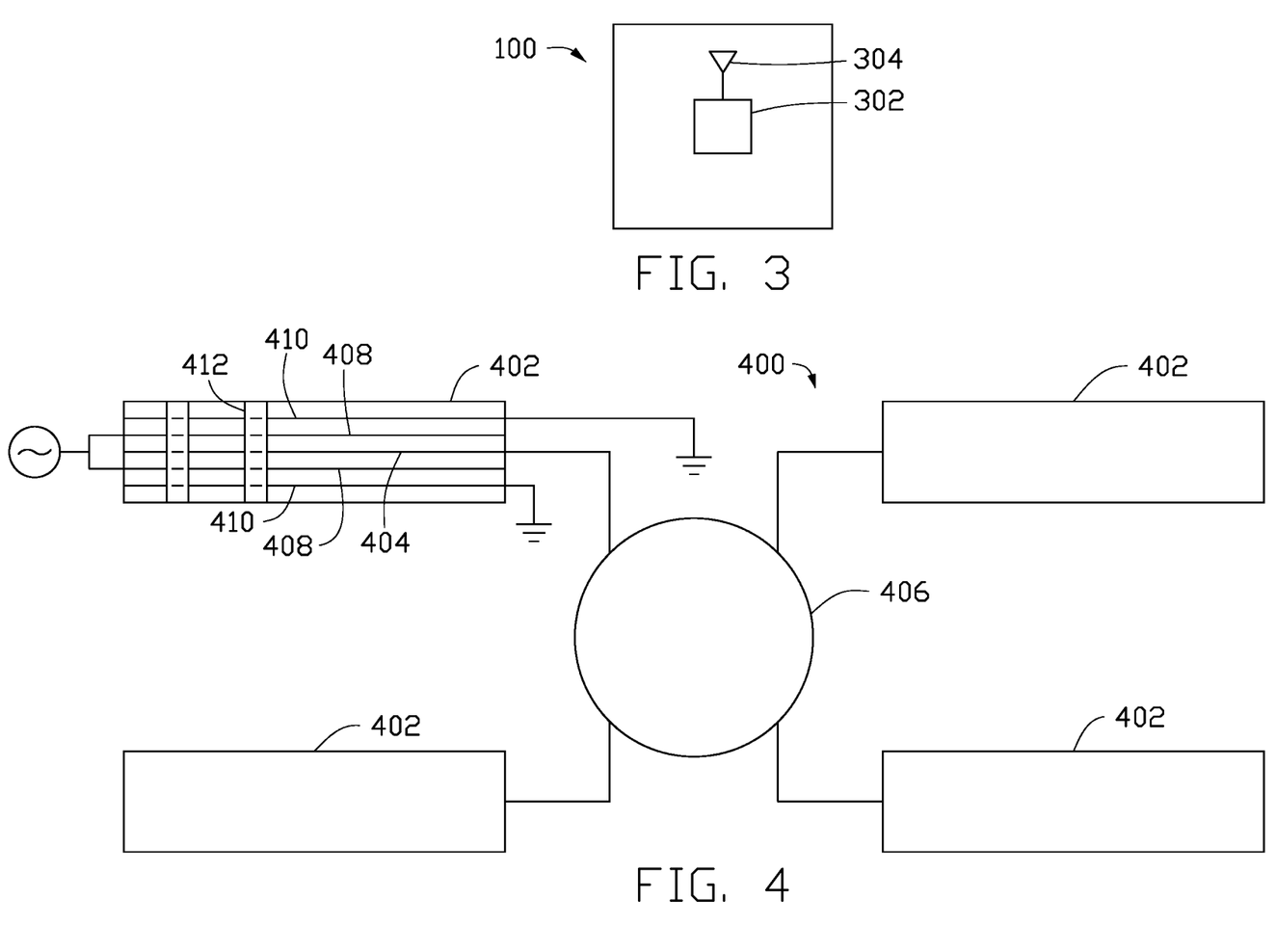
FIG. 3 is a schematic illustration of a device, in this example a cellular telephone, with a DVC and antenna.
FIG. 4 is a schematic illustration of a DVC as one of many possible instantiations of a variable reactance, according to one embodiment.

FIG. 2 is a schematic illustration of a device 100 with a hand 202 nearby. Hand 202 exemplifies one of many possible forms of environmental interactions device 100 is exposed to during operation, which can have an effect on the electrical characteristics of the antenna 102. As the hand 202 moves closer to the device 100 as shown by arrow "A", the electrical environment of the antenna 102 changes. Specifically, the hand 202 typically adds a capacitive load that shifts the resonant frequency of the antenna 102, but the electrical characteristics can change in other ways such as a reduction in the capacitive load or changes in the antenna's inductive load. A similar effect occurs when the device 100 nears the user's head (not shown), is placed on a physical object or in proximity to moving objects, all of which can disturb the electrical characteristics of the antenna 102. As the hand 202 moves away from the device 100 as shown by arrow "B", the electrical characteristics of the antenna 102 change yet again. Specifically, the removal of the hand typically removes a capacitive load that again shifts the resonant frequency of the antenna 102, but other changes in the reactive loading of the antenna are also possible. In actuality, moving the hand 202 away from the device 100 returns the electrical characteristics of the antenna 102 back close to the original condition, where the resonant frequency returns to the state that existed prior to the disturbance of its electrical characteristics. Depending on the specifics of the environment and its changes, and the user's head/hand interaction with device 100 during operation, the changes in the electrical environment of device 100 can represent a change in the inductance of antenna 102, although the majority of cases the changes will result in a change in capacitance. FIG. 3 is a schematic illustration of a device 100, in this example a cellular telephone, with a DVC 302 and antenna 304.

FIG. 4 is a schematic illustration of a Micro Electro Mechanical System (MEMS) based DVC 400, according to one embodiment. The MEMS DVC includes a plurality of cavities 402 that each have an RF electrode 404 that is coupled to a common RF bump 406. Each cavity has one or more pull-in or pull-down electrodes 408 and one or more ground electrodes 410. A switching element 412 moves from a position far away from the RF electrode 404 and a position close to the RF electrode 404 to change the capacitance in the MEMS DVC 400. The MEMS DVC 400 has numerous switching elements 412 and therefore has a large variable capacitance range that can be applied/removed from the antenna aperture in order to maintain a constant resonant frequency and compensate for changes in the electrical characteristics of an antenna that is under the influence of environmental changes or head/hand effect. The MEMS DVC 400 is, in essence, a collection of multiple individually controlled MEMS elements.

Figure 5A:
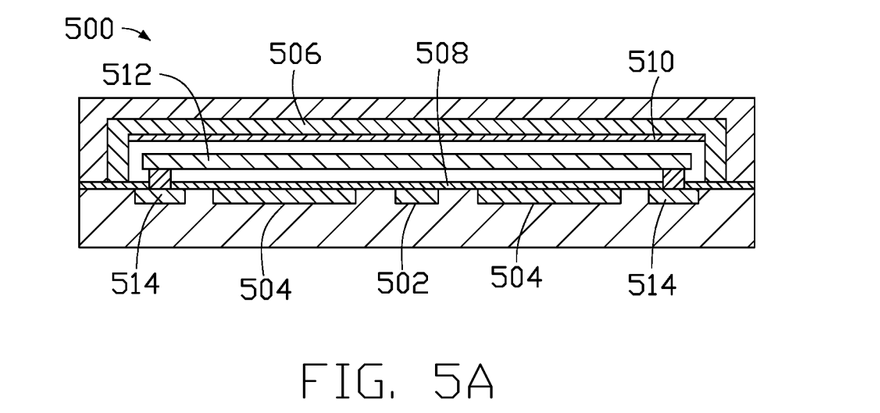
FIGS. 5A-5C are schematic cross-sectional illustrations of a microelectromechanical (MEMS) device that can be utilized as variable reactance according to one embodiment.
Figure 5B:
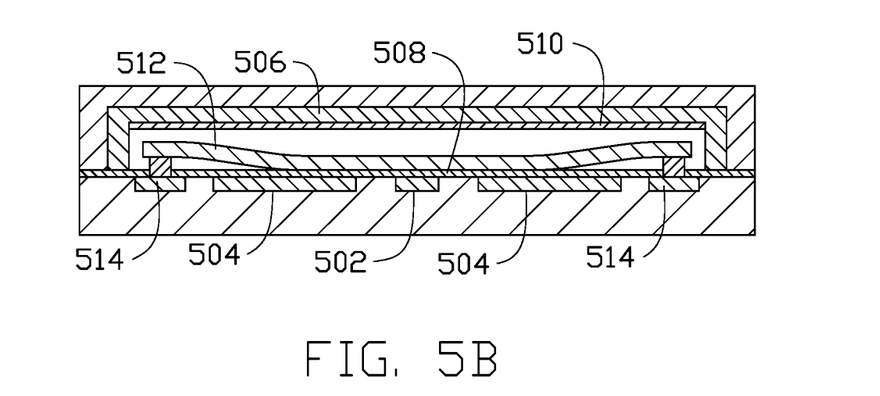
Figure 5C:
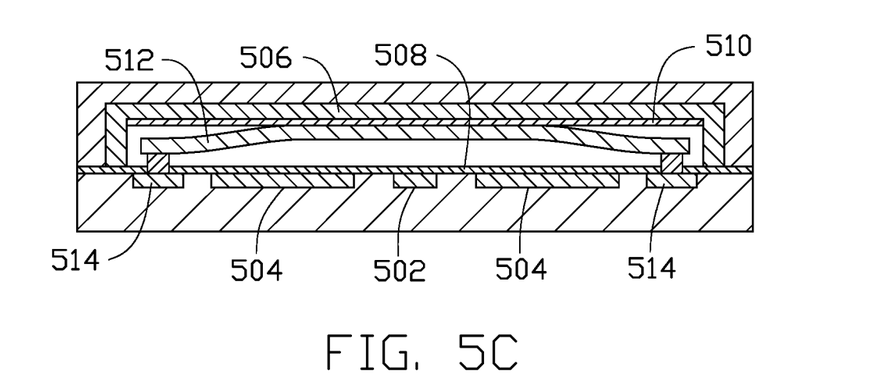

FIGS. 5A-5C are schematic cross-sectional illustrations of a single MEMS element 500 that can create the plurality of switching elements 412 in the plurality of cavities 402 in MEMS DVC 400, according to one embodiment. The MEMS element 500 includes an RF electrode 502, pull-down electrodes 504, a pull-up electrode 506, a first dielectric layer 508 overlying the RF electrode 502 and pull-down electrode 504, a second dielectric layer 510 overlying the pull-up electrode 506, and a switching element 512 that is movable between the first dielectric layer 508 and the second dielectric layer 510. The switching element 512 is coupled to grounding electrodes 514. As shown in FIG. 5B, the MEMS element 500 is in the maximum capacitance position when the switching device 512 is closest to the RF electrode 502. As shown in FIG. 5C, the MEMS element 500 is in the minimum capacitance position when the switching device 512 is furthest away from the RF electrode 502. Thus MEMS element 500 creates a variable capacitor with two different capacitance stages, and integrating a plurality of such MEMS element 500 into a single MEMS DVC 400 is able to create a DVC with great granularity and capacitance range to effect the reactive aperture tuning that is required to maintain a constant resonant frequency, and compensate for changes in the electrical characteristics of an antenna that is under the influence of environmental changes or head/hand effect.

By adjusting the capacitance of an individual MEMS element 500, the capacitance of the DVC 400 can be changed which, hence, leads to changing the capacitance of the device 100 to tune the antenna 304. For a given antenna, only complex measurements (i.e., magnitude and phase) of the reflection coefficient at three different DVC states are needed to obtain a model. The measured antenna reflection coefficient is a complex number:

$$S11M = \text{magnitude } (S11M) * e^{j*phase(S11M)} \quad \text{(Equation 1)}$$

By microwave circuit theory, we have:

$$S11M = \frac{Z-50}{Z+50} = e00 + \frac{e01e10 * S11A}{1 - e11 * S11A} \quad \text{(Equation 2)}$$

$$e00 + S11A * S11M * e11 - S11A * e12 - S11M = 0 \quad \text{(Equation 3)}$$

There are three unknown variables in Equation 3: e00, e11 and e12 (i.e., e12=e00e11−e01e10). Complex measurements are needed to solve the equations for the reflection coefficients of the three DVC states. The reflection coefficients are:

$$S11A1 = \frac{1 - 50 * j\omega C1}{1 + 50 * j\omega C1} \quad \text{(Equation 4)}$$

$$S11A2 = \frac{1 - 50 * j\omega C2}{1 + 50 * j\omega C2} \quad \text{(Equation 5)}$$

$$S11A3 = \frac{1 - 50 * j\omega C3}{1 + 50 * j\omega C3} \quad \text{(Equation 6)}$$

Equations 4-6 solve as follows:

$$e00 + S11A1 * S11M1 * e11 - S11A1 * e12 - S11M1 = 0 \quad \text{(Equation 7)}$$

$$e00 + S11A2 * S11M2 * e11 - S11A2 * e12 - S11M2 = 0 \quad \text{(Equation 8)}$$

$$e00 + S11A3 * S11M3 * e11 - S11A3 * e12 - S11M3 = 0 \quad \text{(Equation 9)}$$

The solution of Equations 7-9 are:

$$e00 = \frac{\begin{array}{l}(S11A1 - S11A2) * S11A3 * S11M1 * S11M2 + \\ (S11A2 - S11A3) * S11A1 * S11M2 * S11M3 + \\ (S11A3 - S11A1) * S11A2 * S11M1 + S11M3)\end{array}}{\begin{array}{l}(S11A2 - S11A3) * S11A1 * S11M1 + \\ (S11A3 - S11A1) * S11A2 * S11M2 + \\ (S11A1 - S11A2) * S11A3 * S11M3\end{array}} \quad \text{(Equation 10)}$$

$$e11 = \frac{\begin{array}{l}(S11A2 - S11A3) * S11M1 + (S11A3 - S11A1) * \\ S11M2 + (S11A1 - S11A2) * S11M3\end{array}}{\begin{array}{l}(S11A2 - S11A3) * S11A1 * S11M1 + \\ (S11A3 - S11A1) * S11A2 * S11M2 + \\ (S11A1 - S11A2) * S11A3 * S11M3\end{array}} \quad \text{(Equation 11)}$$

$$e12 = \frac{\begin{array}{l}(S11M2 - S11M3) * S11A1 * S11M1 + \\ (S11M3 - S11M1) * S11A2 * S11M2 + \\ (S11M1 - S11M2) * S11A3 + S11M3)\end{array}}{\begin{array}{l}(S11A2 - S11A3) * S11A1 * S11M1 + \\ (S11A3 - S11A1) * S11A2 * S11M2 + \\ (S11A1 - S11A2) * S11A3 * S11M3\end{array}} \quad \text{(Equation 12)}$$

The denominators for Equations 10-12 are the same which can reduce the calculation cost. For all other DVC states, the calculation is:

$$C\_DVC = C0 + n * C\_step \quad \text{(Equation 13)}$$

$$S11A1 = \frac{1 - 50 * j\omega C\_DVC}{1 + 50 * j\omega C\_DVC} \quad \text{(Equation 14)}$$

$$S11M = e00 + \frac{(e00 e11 - e12) * S11A}{1 - e11 * S11A} \quad \text{(Equation 15)}$$

Consider the situation where there are 32 states of tunable PIFA with 417 R, 500M to 3 GHz are measured. Assuming C_DVC=C0+n*C_step, states 0, 16 and 31 may be used for the calculation. Using a datasheet value, C0=0.5 pF, C_step=37 fF, C16=C0+37 fF*16 and C31=C0+37 fF*31. The other 29 states measurements can be used to verify the modelling method.

Figure 6:
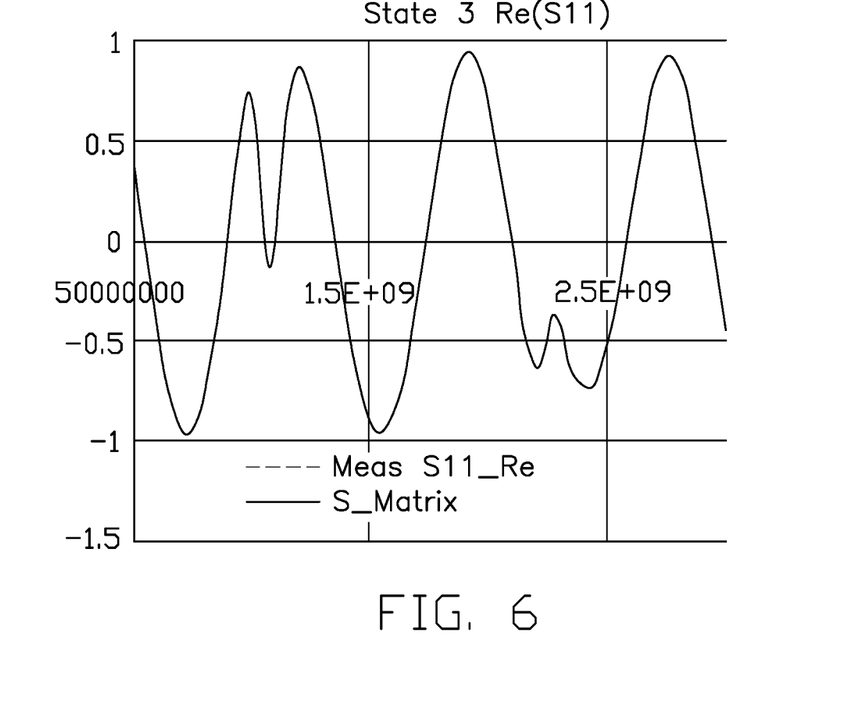
FIGS. 6-9 are graphs showing the calculated states relative to actual measured states.
Figure 7:
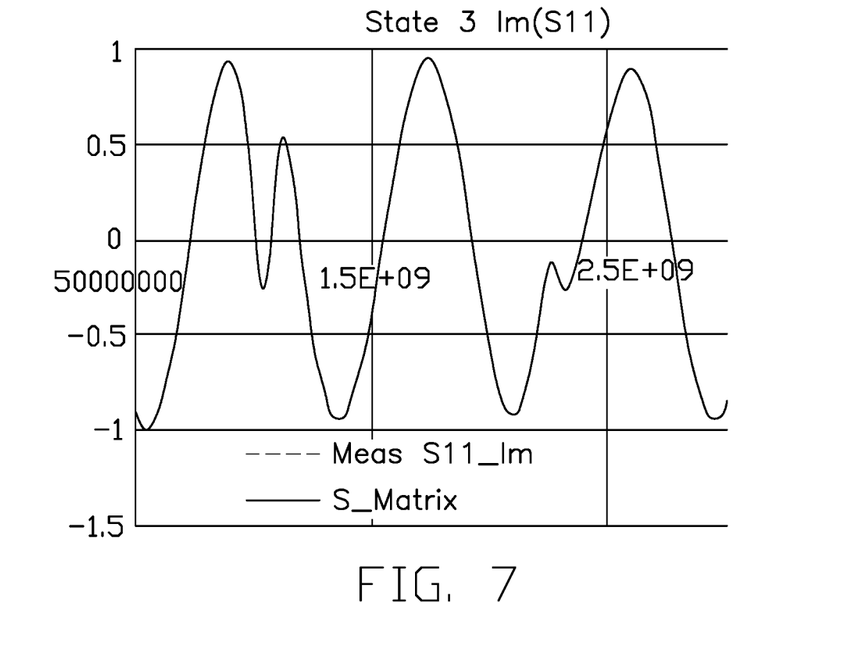
Figure 8:
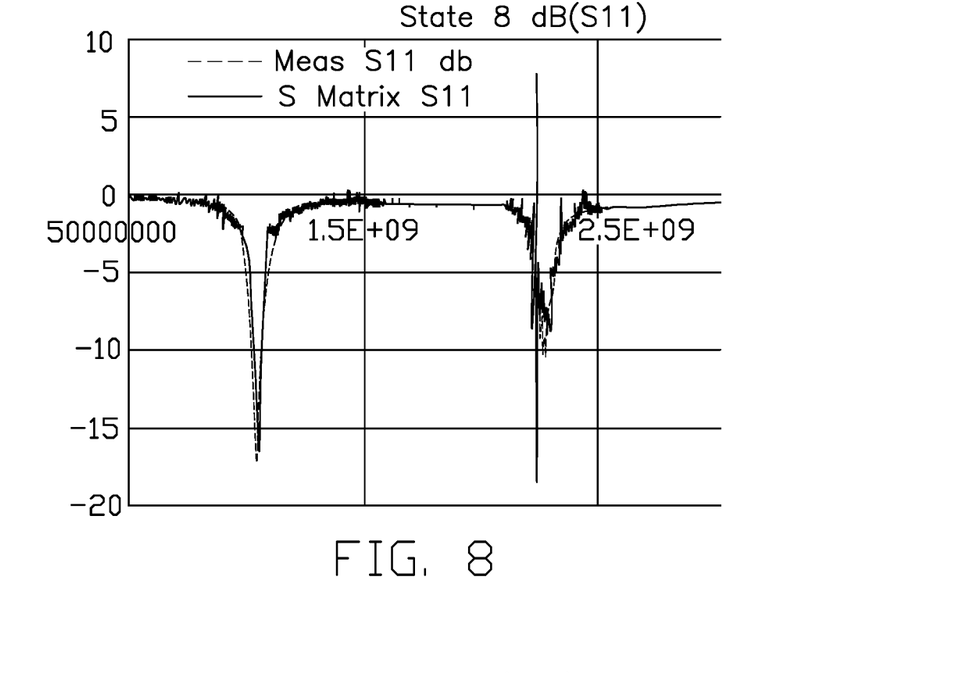
Figure 9:
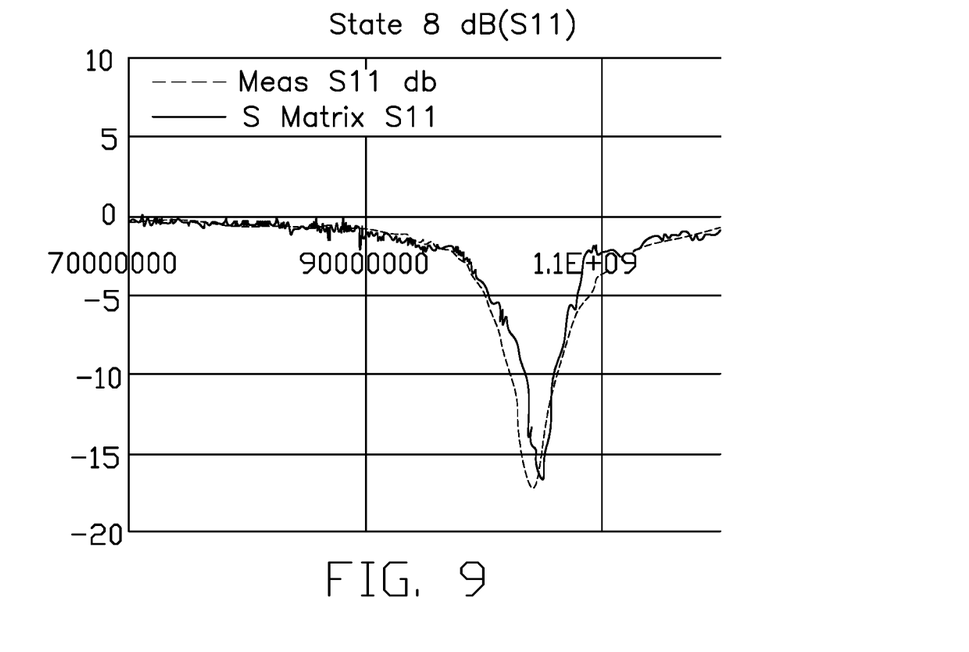

FIGS. 6 and 7 show that the measurements and modeling match very well. To extrapolate the data, the calculation assumes a perfectly linear DVC. The extrapolation shows some noise at the resonant frequency, which is easy to identify (See FIGS. 8 and 9).

Figure 10:
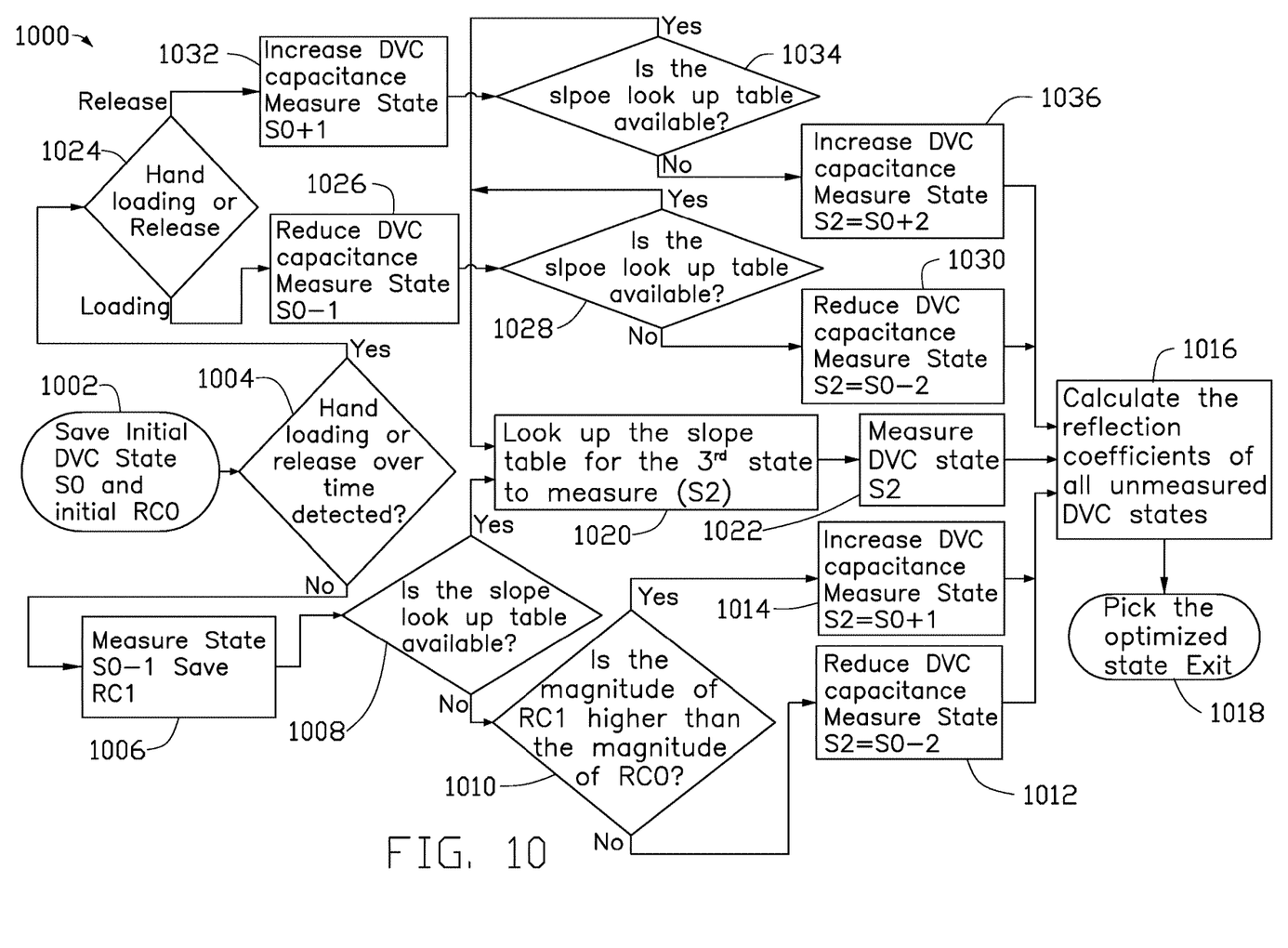
FIG. 10 is a flowchart illustrating a process for tuning an antenna with only three data points.

FIG. 10 is a flowchart 1000 illustrating a process for tuning an antenna with only three data points. The principle of the tuning is to measure three DVC states that are as separated as possible. Then, calculate reflection coefficients of any other DVC states. The first DVC state is picked by the free space antenna measurement. The second DVC state is only one step away from the first DVC state so as to avoid any unexpected over jumps. It is to be understood that the tuning step size is variable and not limited to only one step. Rather, a small step size is preferable, and a single step size is simply one example. If a slope look-up table is available, then the third DVC state is from a look-up table based on the two reflection coefficient measurements. The third DVC state should base far away from the first DVC state as possible. If there is no look-up table available, then the third DVC state to measure is only one step away from the second DVC state. It is to be understood that the tuning step size is variable and not limited to only one step. Rather, a small step size is preferable, and a single step size is simply one example.

The tuning algorithm starts at block 1002 where the initial or first DVC state, S0, and the initial reflection coefficient, RC0, are measured and stored. Thereafter, at block 1004, a determination is made as to whether head/hand loading or head/hand releasing over time has been detected.

If there is no loading or release detected, at block 1006 the second DVC state, S1 is measured as is the second reflection coefficient RC1. The second DVC state S1 is one step away from the first DVC state S0. Specifically, the second DVC state S1 is one step below the first DVC state S0. In other words, S1=S0−1. Next, in block 1008, a determination is made as to whether a slope look-up table is present.

If there is no slope look-up table available, then at block 1010, the magnitude of the second reflection coefficient RC1 is compared to the magnitude of the first reflection coefficient RC0. If the magnitude of RC1 is lower than the magnitude of RC0, then the DVC capacitance measured state is reduced another step to S2, which equals S0-2 in block 1012. If, however, the magnitude of RC1 is higher than the magnitude of RC0, then the DVC capacitance measured state is increased a step from S0 to S2, which equals S0+1 in block 1014. Thereafter, the reflection coefficients $RC_x$ for all unmeasured DVC states $S_x$ are calculated in block 1016 and the optimized DVC state is chosen for tuning the antenna in block 1018.

If there is a slope look-up table at block 1008, then the slope look-up table is consulted to obtain the third DVC state S2 that is to be measured in block 1020. Thereafter, the third DVC state S2 is measured in block 1022, the reflection coefficients $RC_x$ for all unmeasured DVC states $S_x$ are calculated in block 1016 and the optimized DVC state is chosen for tuning the antenna in block 1018.

Looking back at block 1004, if there is a loading or releasing detected, then a determination is made in block 1024 of whether in fact loading or releasing is detected. If a release is loading is detected, then the DVC measured state is reduced to the second DVC state S1, which equals S0-1 at block 1026. At block 1028, a determination is made as to whether a slope look-up table is available.

If there is a slope look-up table at block 1028, then the slope look-up table is consulted to obtain the third DVC state S2 that is to be measured in block 1020. Thereafter, the third DVC state S2 is measured in block 1022, the reflection coefficients $RC_x$ for all unmeasured DVC states $S_x$ are calculated in block 1016 and the optimized DVC state is chosen for tuning the antenna in block 1018.

If there is no slope look-up table available at block 1028, the DVC measured state is reduced another step to S2, which equals S0-2 in block 1030. Thereafter, the reflection coefficients $RC_x$ for all unmeasured DVC states $S_x$ are calculated in block 1016 and the optimized DVC state is chosen for tuning the antenna in block 1018.

If a release is loading is detected at block 1024, then the DVC measured state is increased to the second DVC state S1, which equals S0+1 at block 1032. At block 1034, a determination is made as to whether a slope look-up table is available.

If there is a slope look-up table at block 1034, then the slope look-up table is consulted to obtain the third DVC state S2 that is to be measured in block 1020. Thereafter, the third DVC state S2 is measured in block 1022, the reflection coefficients $RC_x$ for all unmeasured DVC states $S_x$ are calculated in block 1016 and the optimized DVC state is chosen for tuning the antenna in block 1018.

If there is no slope look-up table available at block 1034, the DVC measured state is increased another step to S2, which equals S0+2 in block 1036. Thereafter, the reflection coefficients $RC_x$, for all unmeasured DVC states $S_x$ are calculated in block 1016 and the optimized DVC state is chosen for tuning the antenna in block 1018.

The tuning algorithm accuracy discussed in regards to FIG. 10 improves if the data points are taken at widely spaced capacitance intervals. However, a large change in capacitance can detune the antenna to a point where the communication between the device, such as a cellular telephone, and network is disrupted. The slope look-up table is used to maximize the capacitance interval between S1 and S2 without disrupting communication between device and network. The slope look-up table is also used to determine if an increase or decrease capacitance is needed to improve overall system performance.

The value of the slope between S0 and S1 indicates if the reflection coefficient is changing slowly or quickly as a function of capacitance. A large slope indicates a large change in reflection coefficient with capacitance, which in turn indicates only a small change in capacitance can be made for the next step, S2, to avoid communication problems. If the slope is small, then a larger change in capacitance can be made between S1 and S2 with limited risk of disrupting the communication channel. In addition, the sign of the slope, either positive or negative, indicates if an increase or decrease in capacitance is needed to improve antenna performance. Typically, the presence of the user's hand and head in contact with or near the device will add capacitive loading to the antenna. Reducing the capacitance state will improve the overall performance by adjusting the antenna system resonant frequency closer to the frequency of interest.

The slope look-up table is determined during the phone design stage and is dependent on the antenna design for a particular device model, such as a phone model. Once the slope look-up table is determined, the slope look-up table remains the same for all devices, such as cellular telephones, of the same model and does not need to be recalibrated for each individual phone. By using the three data points, the antenna can be accurately and easily tuned in situ.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
   measuring a reflection coefficient of a device at a first DVC state;
   changing the first DVC state to a second DVC state;
   measuring the reflection coefficient of the device at the second DVC state;
   determining whether a slope look-up table is available; either
   a) reviewing the slope look-up table for a third DVC state to measure or
   b) changing the second DVC state to the third DVC state;
   measuring the reflection coefficient of the device at the third DVC state;
   calculating reflection coefficients for all unmeasured DVC states based on the measured reflection coefficients of the first, second, and third DVC states; and
   selecting a desired DVC state.

2. The method of claim 1, further comprising detecting an increase in the reflection coefficient.

3. The method of claim 1, wherein further comprising detecting a decrease in the reflection coefficient.

4. The method of claim 1, wherein the determining comprises determining that a slope look-up table is available.

5. The method of claim 4, further comprising reviewing the slope look-up table for the third DVC state to measure.

6. The method of claim 1, wherein the determining comprises determining that a slope look-up table is not available.

7. The method of claim 6, further comprising changing the second DVC state to the third DVC state.

8. The method of claim 7, wherein changing the second DVC state comprises increasing the capacitance.

9. The method of claim 8, wherein changing the first DVC state to the second DVC state comprises increasing the capacitance.

10. The method of claim 7, wherein changing the second DVC state comprises decreasing the capacitance.

11. The method of claim 10, wherein changing the first DVC state to the second DVC state comprises decreasing the capacitance.

12. A method, comprising:
    measuring a reflection coefficient of a device at a first DVC state;
    measuring the reflection coefficient of the device at a second DVC state;
    reviewing a slope look-up table for a third DVC state to measure;
    measuring the reflection coefficient of the device at the third DVC state;
    calculating reflection coefficients for all unmeasured DVC states based on the measured reflection coefficients of the first, second, and third DVC states; and
    selecting a desired DVC state.

13. The method of claim 12, wherein no change in the reflection coefficient is detected between the reflection coefficient at the first DVC state and the reflection coefficient at the second DVC state.

14. The method of claim 12, further comprising determining that a slope look-up table is available.

15. The method of claim 14, further comprising reviewing the slope look-up table for the third DVC state to measure.

16. A method, comprising:
    measuring a reflection coefficient of a device at a first DVC state;
    measuring the reflection coefficient of the device at a second DVC state;
    changing the second DVC state to a third DVC state;
    measuring the reflection coefficient of the device at the third DVC state;

calculating reflection coefficients for all unmeasured DVC states based on the measured reflection coefficients of the first, second, and third DVC states; and selecting a desired DVC state.

17. The method of claim 16, wherein no change in capacitance is detected between measuring the capacitance to obtain the first DVC state and measuring the capacitance in the second DVC state.

18. The method of claim 16, further comprising determining that a slope look-up table is not available.

19. The method of claim 18, further comprising changing the second DVC state to the third DVC state.

20. The method of claim 19, wherein changing the second DVC state comprises increasing the capacitance.

21. The method of claim 19, wherein changing the second DVC state comprises decreasing the capacitance.

* * * * *